United States Patent [19]
Tan et al.

[11] Patent Number: 5,892,787
[45] Date of Patent: Apr. 6, 1999

[54] N-DRIVE, P-COMMON LIGHT-EMITTING DEVICES FABRICATED ON AN N-TYPE SUBSTRATE AND METHOD OF MAKING SAME

[75] Inventors: Michael R. T. Tan, Menlo Park; Albert T. Yuen, Cupertino; Shih-Yuan Wang, Palo Alto; Ghulam Hasnain, Stanford; Yu-Min Houng, Cupertino, all of Calif.

[73] Assignee: Hewlett-Packard Company, Palo Alto, Calif.

[21] Appl. No.: 635,838

[22] Filed: Apr. 22, 1996

Related U.S. Application Data

[63] Continuation-in-part of Ser. No. 330,033, Oct. 27, 1994.
[51] Int. Cl.[6] .................................................... H01S 3/19
[52] U.S. Cl. .................................. 372/96; 372/43; 372/45
[58] Field of Search ................................ 372/43, 50, 45, 372/96; 437/40, 110

[56] References Cited

U.S. PATENT DOCUMENTS

| | | | |
|---|---|---|---|
| 5,073,511 | 12/1991 | Musumeci et al. | 437/40 |
| 5,212,706 | 5/1993 | Jain | 372/50 |
| 5,263,041 | 11/1993 | Pankove | 372/45 |
| 5,338,944 | 8/1994 | Edmond et al. | 257/76 |
| 5,356,831 | 10/1994 | Calviello et al. | 437/110 |

FOREIGN PATENT DOCUMENTS

| | | | |
|---|---|---|---|
| 0580104 | 1/1994 | European Pat. Off. | H01S 3/25 |
| 62-291192 | 12/1987 | Japan . | |

OTHER PUBLICATIONS

Sugg et al, "n–p–(p+n+)–n AlGaAs–GaAs–InGaAs quantum well laser with p+n+ GaAs–InGaAs tunnel contact on n–GaAs", Appl. Phys. Lett. 62(20), pp. 2510–2512, May 17, 1993.

Richard et al, "High currently density carbon doped strained layer GaAs(p+)–InGaAs(n+)–GaAs(n+) pn tunnel diodes", Appl. Phys. Lett. 63(26)), pp. 3613–3615, Dec. 27, 1993.

(List continued on next page.)

Primary Examiner—John D. Lee
Assistant Examiner—Yisun Song
Attorney, Agent, or Firm—Ian Hardcastle

[57] ABSTRACT

A substantially n-type substrate structure having a p-type surface for use in semiconductor devices as a substitute for a p-type semiconductor substrate. The substrate structure comprises a substrate region and a buffer region. The substrate region is a region of n-type compound semiconductor, and includes a degeneratively n-doped portion adjacent its first surface. The buffer region is a region of compound semiconductor doped with a p-type dopant. The buffer region is located on the first surface of the substrate region and includes a surface remote from the substrate region that provides the p-type surface of the substrate structure. The buffer region also includes a degeneratively p-doped portion adjacent the degeneratively n-doped portion of the substrate region. The substrate structure includes a tunnel junction between the degeneratively n-doped portion of the substrate region and the degeneratively p-doped portion of the buffer region. The substrate structure is made by degeneratively doping a substrate region of n-type compound semiconductor material adjacent its first surface with an n-type impurity, and depositing a layer of compound semiconductor material doped with a p-type impurity on the first surface of the substrate region to form a buffer region that includes a surface remote from the substrate region. In the course of depositing the compound semiconductor material to form the buffer region, the compound semiconductor material is degeneratively doped with the p-type impurity at least in a portion adjacent the substrate region to form a tunnel junction between the substrate region and the buffer region.

12 Claims, 6 Drawing Sheets

OTHER PUBLICATIONS

Tan et al, "Numerical Simulation of Backgating Suppression in HEMTs with a Low Temperature MBE—Growth GaAs Buffer Layer Between the Substrate and Active Layers", Jpn. J. Appl. Phys. vol. 33, pp. 826–829, Jun. 15, 1994.

Hadley, M.S. et al., "High Single–Transverse–Mode Output from External–Cavity Surface–Emitting Laser Diodes", Applied Physics Letters, No. 12, Sep. 20, 1993, pp. 1607–1609.

Wipiejewski, T et al., "Characterization of Two–Sided Output Vertical–Cavity Laser Diodes by External Optical Feedback Modulation", LEOS '93 Conference Proceedings, Nov. 15–18, 1993, San Jose, California, pp. 564–565.

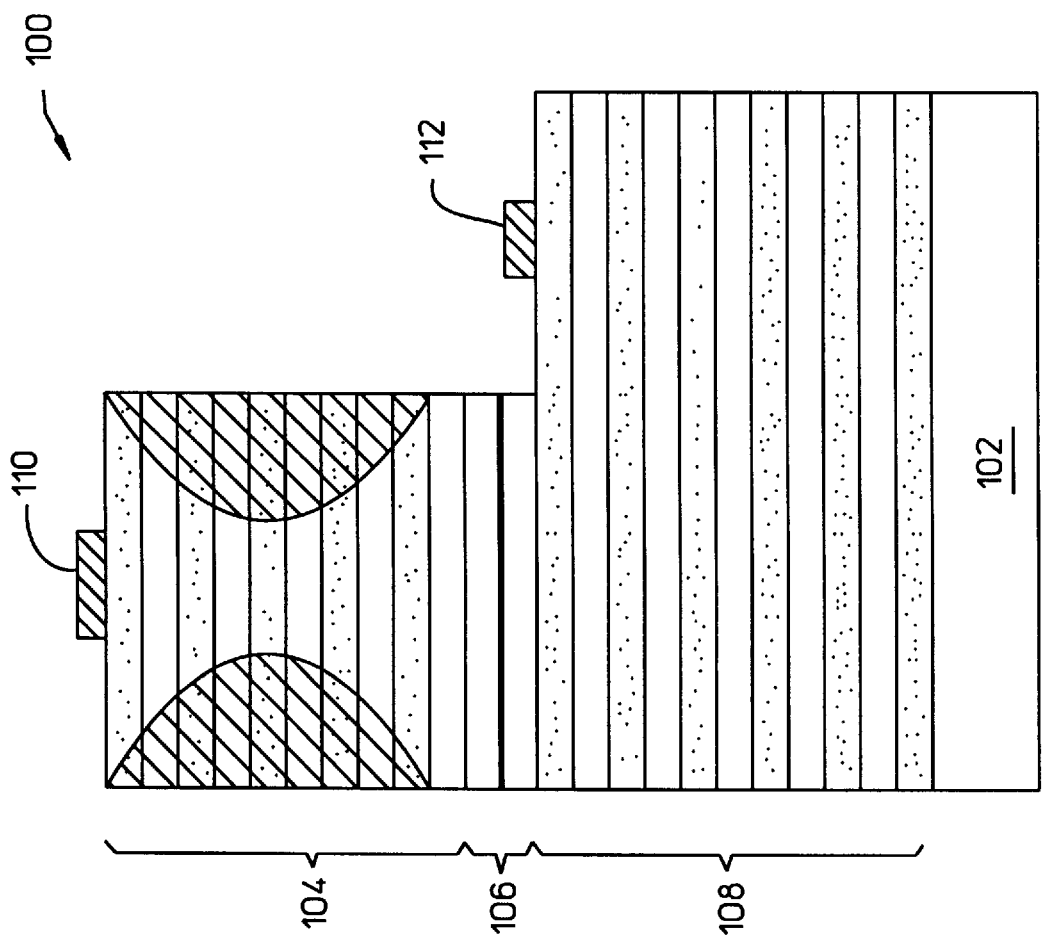

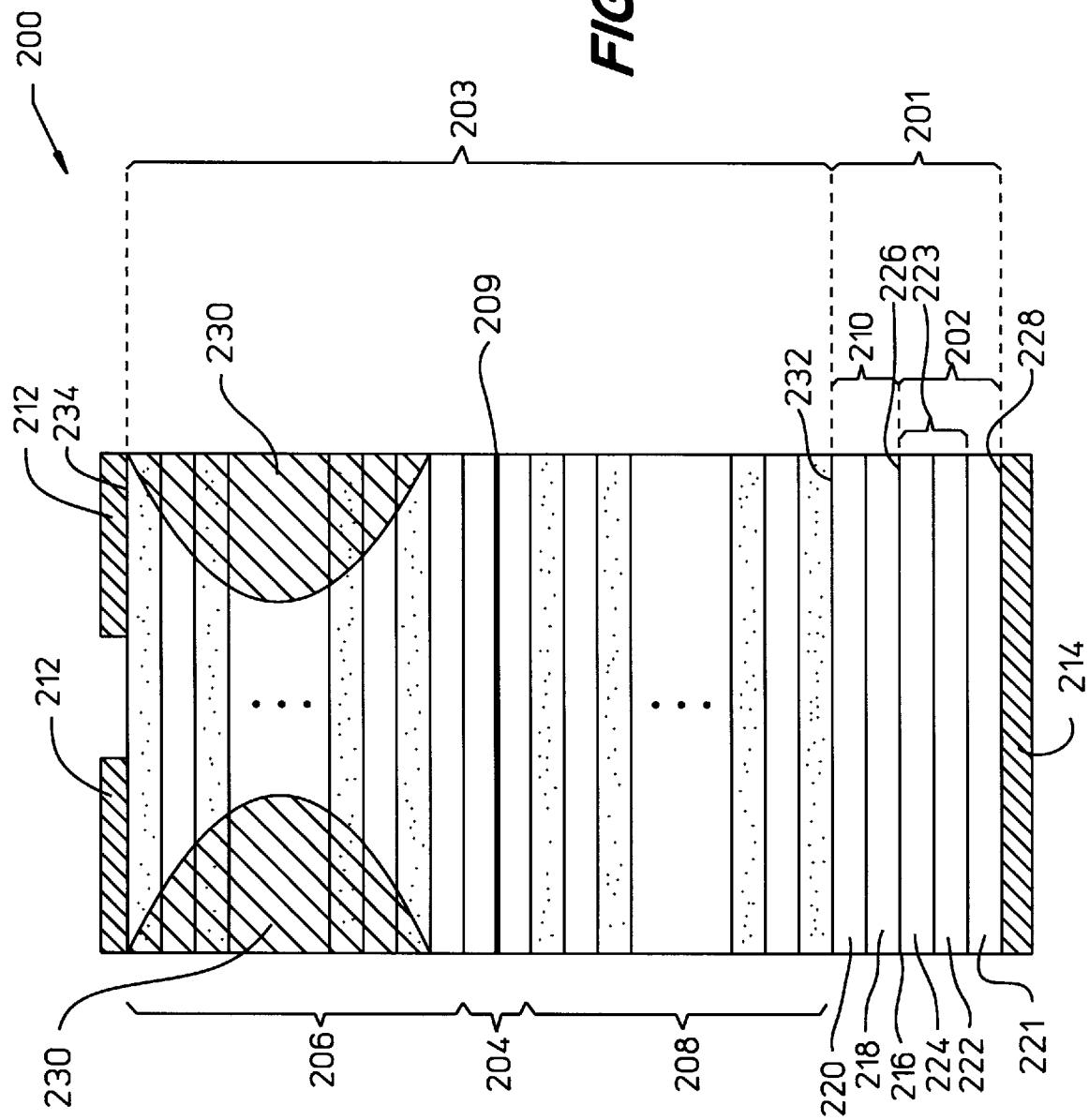

N-DRIVE, P-COMMON LIGHT-EMITTING DEVICES FABRICATED ON AN N-TYPE SUBSTRATE AND METHOD OF MAKING SAME

PRIOR APPLICATION

This application is a Continuation-in-Part of pending prior application Ser. No. 08/330,033, filed on 27 Oct. 1994.

FIELD OF THE INVENTION

The invention relates generally to light-emitting devices and, more specifically, to n-drive, p-common light-emitting devices fabricated on an n-type substrate.

BACKGROUND OF THE INVENTION

Originally, semiconductor lasers were diode structures in which light emitted from the edge of the laser structure was parallel to the surface of the semiconductor wafer. However, this edge-emitting laser structure does not lend itself to cost-effective fabrication of two-dimensional arrays of laser diodes. A second class of laser diodes, well suited for fabrication of laser arrays, is fabricated such that the laser structure is perpendicular to the surface of the semiconductor wafer so that light is emitted perpendicular to the surface. These lasers in this class of lasers are commonly known as surface emitting lasers (SELs).

Both classes of lasers are formed on a substrate which may be semi-insulating or may be conductive with either p-type or n-type doping. FIG. 1A shows a cross-sectional view of the conventional n-drive SEL 100 formed on the semi-insulating substrate 102. The surface emitting laser 100 may be regarded as an n-i-p diode, comprised of an n-type mirror region 104, an active region 106, and a p-type mirror region 108. Electrical connections are made via the electrode 110 formed on the top surface of the n-type mirror region 104 and electrode 112 formed on the p-type mirror region 108.

To make electrical contact with the p-type region 108, an etch is made through both the n-type mirror region 104 and the active region 106 to the p-type region 108. This is problematic since the p-type contact etch exposes the epitaxial layers 104, 106 and 108 which, when exposed, have a tendency to oxidize. Further, the p-type contact etch creates a non-planar structure which leads to potential reliability problems and increased manufacturing complexity. Further, defects added to semi-insulating substrates to make the substrate isolating can reduce the reliability of the semiconductor laser device.

FIG. 1B shows a cross-sectional view of the conventional n-drive surface emitting laser 120 formed on the p-type substrate 122. The SEL is comprised of the n-type mirror region 124, the active region 126, and the p-type mirror region 128. Electrical connections are made via the electrode 130 formed on the surface of the n-type mirror region 124 and the electrode 132 formed on the surface of the p-type substrate 122, remote from the p-type mirror region 128.

The preferred method of forming the n-type, i, and p-type regions is by molecular beam epitaxy (MBE). The only commonly-available p-type group III-V substrate is doped with zinc. However, at typical MBE growth temperatures, zinc diffuses out from the substrate, which causes an unacceptable background concentration in the mirror regions 124 and 128 and the active region 126. Further, zinc diffusing out from the substrate contaminates the molecular beam epitaxy chamber, which requires the addition of a cleaning step after each zinc contamination. Finally, p-type GaAs substrates are 3-4 times more expensive than n-type GaAs substrates, have a greater etch pit density, and are less readily available.

FIG. 1C shows a cross-sectional view of the surface emitting laser 140 formed on the n-type substrate 142. The SEL is comprised of the n-type mirror region 144, the active region 146, and the p-type mirror region 148. The SEL 140 shown in FIG. 1C is a p-drive SEL. Unlike the n-drive current driven SELs shown in FIGS. 1A and 1B, the p-drive SEL is typically voltage driven. Although current drivers for p-drive SELs exist, they have problems. For example, available silicon pnp drivers typically have insufficient speed to operate at the data rates of current optical communication systems. GaAs pnp drivers are faster but expensive.

Voltage driven p-drive SELs also have problems. Voltage driven p-drive SELs in SEL arrays require precise manufacturing control to make each laser in the array have the same $V_f$. Nonuniformities in $V_f$ require that each laser in the array be individually pre-biased, which increases the cost of the laser drivers.

N-drive SELs may be created from the structure shown in FIG. 1C by sawing between individual lasers and flipping the p-drive SELs. However, this method cannot be used to make SEL arrays.

High-intensity light-emitting diodes (LEDs) can be used in many applications instead of lasers. Light-emitting diodes are simpler to manufacture than lasers and are consequently lower in cost. Light-emitting diodes may be made by replacing the n-type mirror region and the p-type mirror region in the structures just described with a homogeneous layer of n-type semiconductor material and a homogeneous layer of p-type semiconductor material, respectively. N-drive LEDs have advantages over p-drive LEDs similar to the advantages of n-drive lasers over p-drive lasers discussed above.

Near infra-red LEDs operating in the 800–880 nm range typically consist of a GaAs/AlGaAs double heterojunction structures grown epitaxially lattice-matched on GaAs substrates. Since GaAs is opaque to the light generated by the LED, the LEDs are typically formed to emit light from their top surface to save having to etch a hole through the substrate. Light emission from the top surface of the LED requires either a transparent top electrode or an annular top electrode to funnel the current into a region defined by a buried confinement or current-blocking layer. Irrespective of the configuration of the top electrode, the structures just described have additional series resistance compared with the direct vertical current injection geometry of back-surface emitting LEDs. The additional series resistance is a significant problem in LEDs because of the higher operating currents of typical LEDs compared with typical lasers. The additional series resistance increases the voltage required to drive the LEDs, increases the heat dissipated in the LED, and reduces the overall electro-optical efficiency of the LED.

One known approach to reducing the series resistance of top-emitting LEDs using an annular top electrode is to form the LED by growing an n-type AlGaAs layer using organometallic vapor-phase epitaxy (OMVPE) on a p-type GaAs substrate. This structure has less series resistance because the sheet resistivity that can be achieved in n-type AlGaAs is substantially lower than that which can be achieved in p-type AlGaAs. The sheet resistivity of n-type AlGaAs is lower than that of p-type AlGaAs primarily because the mobility of electrons is substantially greater than that of holes. However, the structure just described provides the advantage of lower resistance at the expense of requiring a p-type substrate, which has the disadvantages discussed above.

Accordingly, a way to form n-drive semiconductor light-emitting devices such as surface-emitting lasers and LEDs on an n-type substrate is needed so that the advantages of faster drive speed and lower series resistance of n-drive devices can be obtained without the disadvantages of a p-type substrate.

SUMMARY OF THE INVENTION

To overcome the disadvantages of known p-type substrates, the invention provides a substantially n-type substrate structure having a p-type surface for use in semiconductor devices as a substitute for a p-type semiconductor substrate. The substrate structure comprises a substrate region and a buffer region. The substrate region is a region of n-type compound semiconductor, and includes a first surface and a second surface, and a degeneratively n-doped portion adjacent the first surface. The buffer region is a region of compound semiconductor doped with a p-type dopant. The buffer region is located on the first surface of the substrate region and includes a surface remote from the substrate region that provides the p-type surface of the substrate structure. The buffer region also includes a degeneratively p-doped portion adjacent the degeneratively n-doped portion of the substrate region. Finally, the substrate structure includes a tunnel junction between the degeneratively n-doped portion of the substrate region and the degeneratively p-doped portion of the buffer region.

The substrate structure may additionally comprise a layer of degenerately-doped strained pseudomorphic semiconductor material on one side of the tunnel junction. The strained pseudomorphic semiconductor material has a lower band gap than the compound semiconductor materials of the substrate region and the buffer region.

The invention also provides a light-emitting device having electrical connections made to regions of the same conductivity type. The light-emitting device comprises a substrate structure and a light-generating structure. The substrate structure includes a substrate region, a buffer region, a tunnel junction between the substrate region and the buffer region, a first electrode, and a second electrode.

The substrate region is a region of compound semiconductor material of a first conductivity type. The substrate region includes a first surface opposite a second surface. The buffer region is a region of compound semiconductor material of a second conductivity type, opposite the first conductivity type. The buffer region is located on the first surface of the substrate region and includes a surface remote from the substrate region.

The light-generating structure includes an upper region of compound semiconductor material of the first conductivity type, a lower region of compound semiconductor material of the second conductivity type, and a light-generating region between the upper region and the lower region. The upper region includes a surface remote from the lower region. The light-generating structure is located on the substrate structure with the lower region adjacent the surface of the buffer region.

The first electrode is located on the second surface of the substrate region, and the second electrode is located on the surface of the upper region.

The invention further provides a method of making a substantially n-type substrate structure having a p-type surface for use in semiconductor devices as a substitute for a p-type semiconductor substrate. In the method, a substrate region of n-type compound semiconductor material is provided. The substrate region includes a first surface opposite a second surface. The substrate region is degeneratively doped adjacent the first surface with an n-type impurity. Finally, a layer of compound semiconductor material doped with a p-type impurity is deposited on the first surface of the substrate region to form a buffer region that includes a surface remote from the substrate region. In the course of depositing the compound semiconductor material to form the buffer region, the compound semiconductor material is degeneratively doped with the p-type impurity at least in a portion adjacent the substrate region to form a tunnel junction between the substrate region and the buffer region.

Finally, the invention provides a method of making a light-emitting device having electrical connections made to regions of the same conductivity type. In the method, a substrate structure is formed by providing a substrate region of compound semiconductor material of a first conductivity type. The substrate region includes a first surface opposite a second surface. The substrate region is degeneratively doped adjacent the first surface with an impurity of the first conductivity type. Then, a layer of compound semiconductor material doped with an impurity of a second conductivity type, opposite the first conductivity type, is deposited on the first surface of the substrate region to form a buffer region that includes a surface remote from the substrate region. In the course of depositing the layer of compound semiconductor material to form the buffer region, the compound semiconductor material is degeneratively doped with the impurity of the second conductivity type at least in a portion adjacent the substrate region to form a tunnel junction between the substrate region and the buffer region.

The light-generating structure is built on the surface of the buffer region of the substrate structure. The light-generating structure includes an upper region of compound semiconductor material of the first conductivity type, a lower region of compound semiconductor material of the second conductivity type, and a light-generating region sandwiched between the upper region and the lower region. The upper region includes a surface remote from the lower region. The lower region contacts the surface of the buffer region.

Finally, a first electrode is formed on the second surface of the substrate region, and a second electrode is formed on the surface of the upper region.

BRIEF DESCRIPTION OF THE DRAWINGS

FIG. 1A is a cross-sectional view of a conventional n-drive surface emitting laser (SEL) formed on a semi-insulating substrate.

FIGS. 2A and 2B are cross-sectional views of preferred embodiments of an n-drive SEL fabricated on a substantially n-type substrate structure according to the invention as a first example of a light-emitting device according to the invention.

DETAILED DESCRIPTION OF THE INVENTION

Figure 1B:
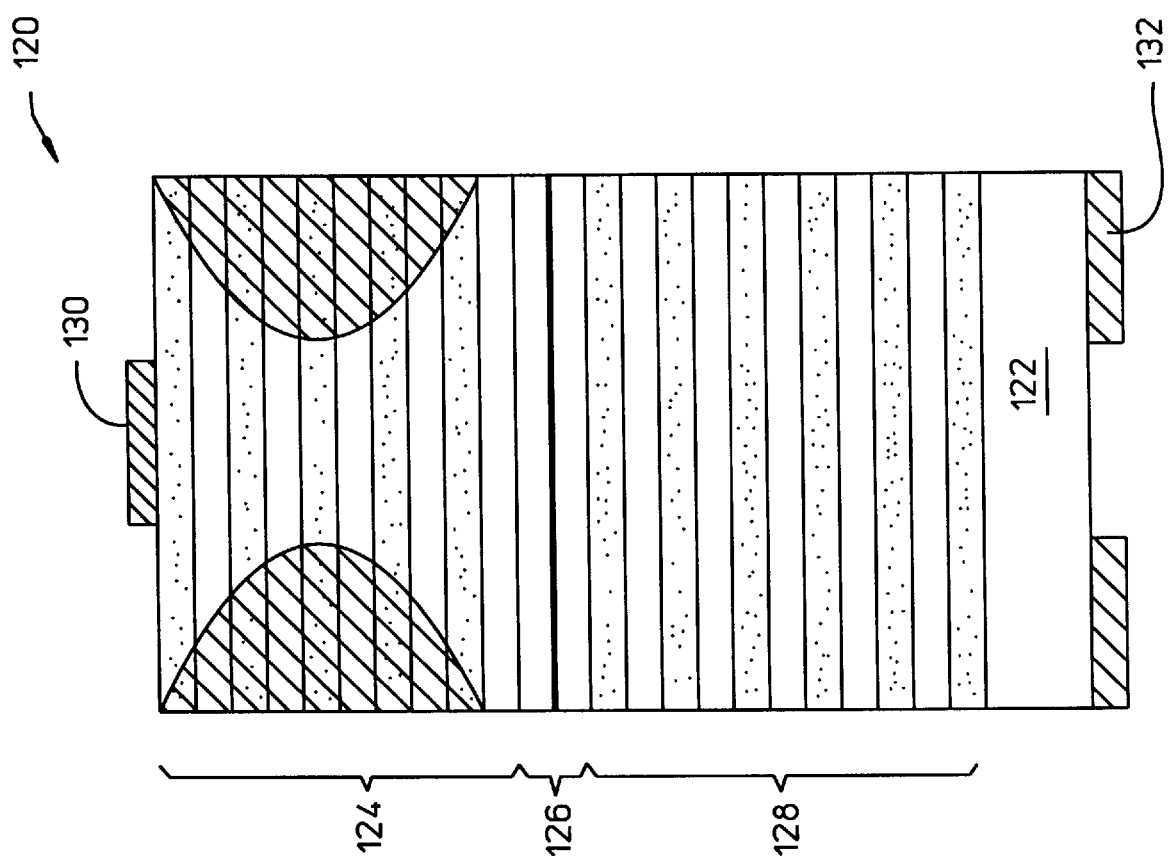
FIG. 1B is a cross-sectional view of a conventional n-drive surface emitting laser formed on a p-type substrate
Figure 1C:
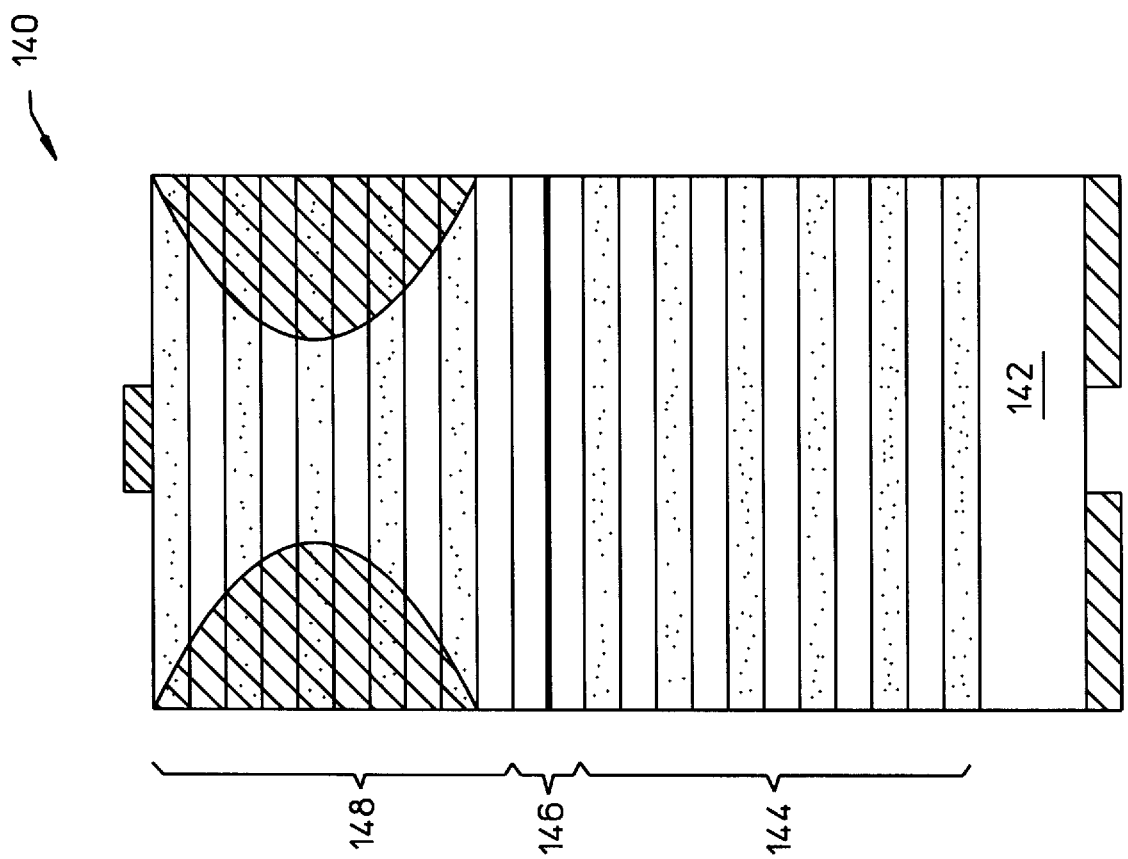
FIG. 1C is a cross-sectional view of a p-drive surface emitting laser formed on an n-type substrate.
Figure 2A:
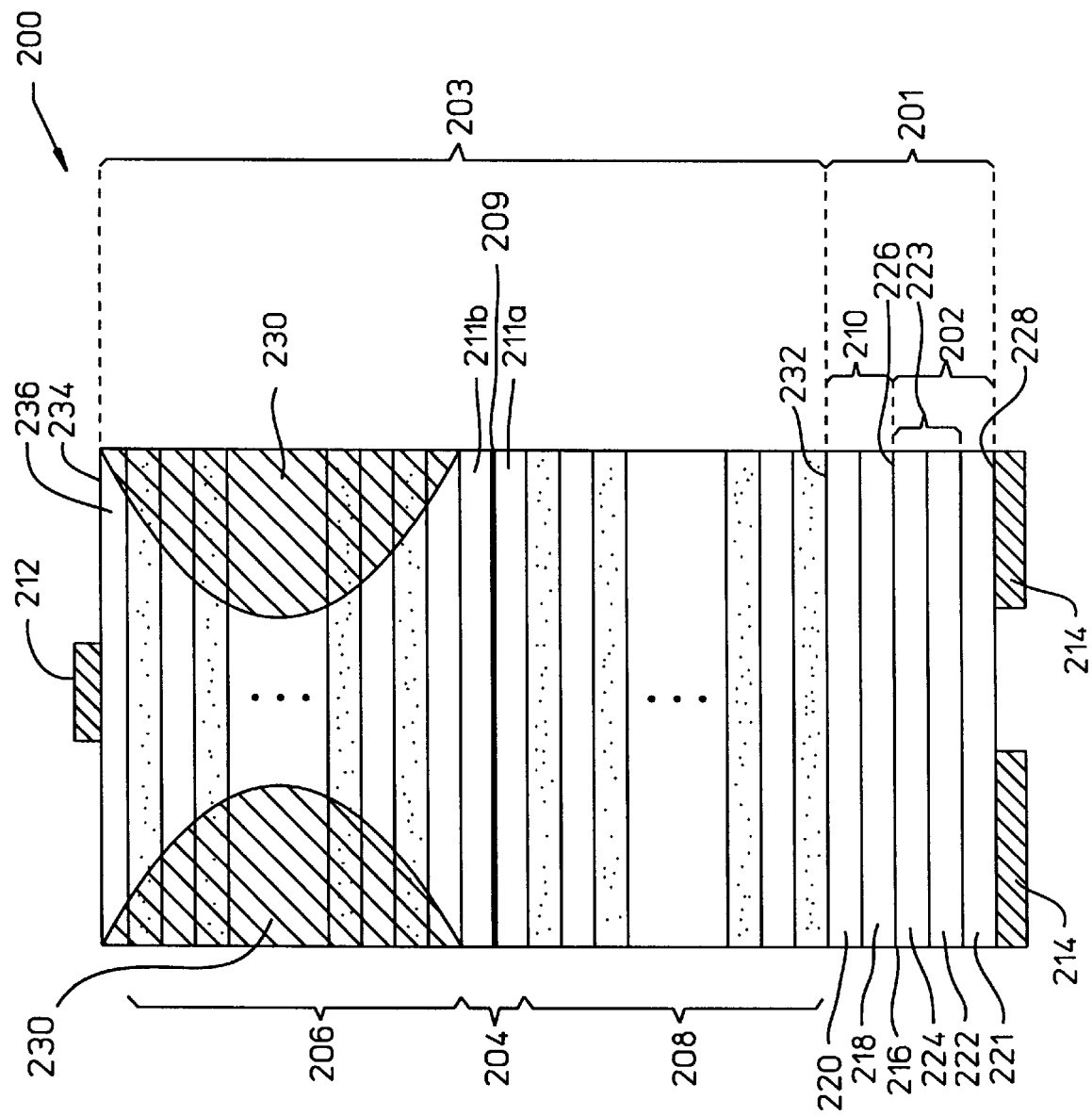
Figure 3:
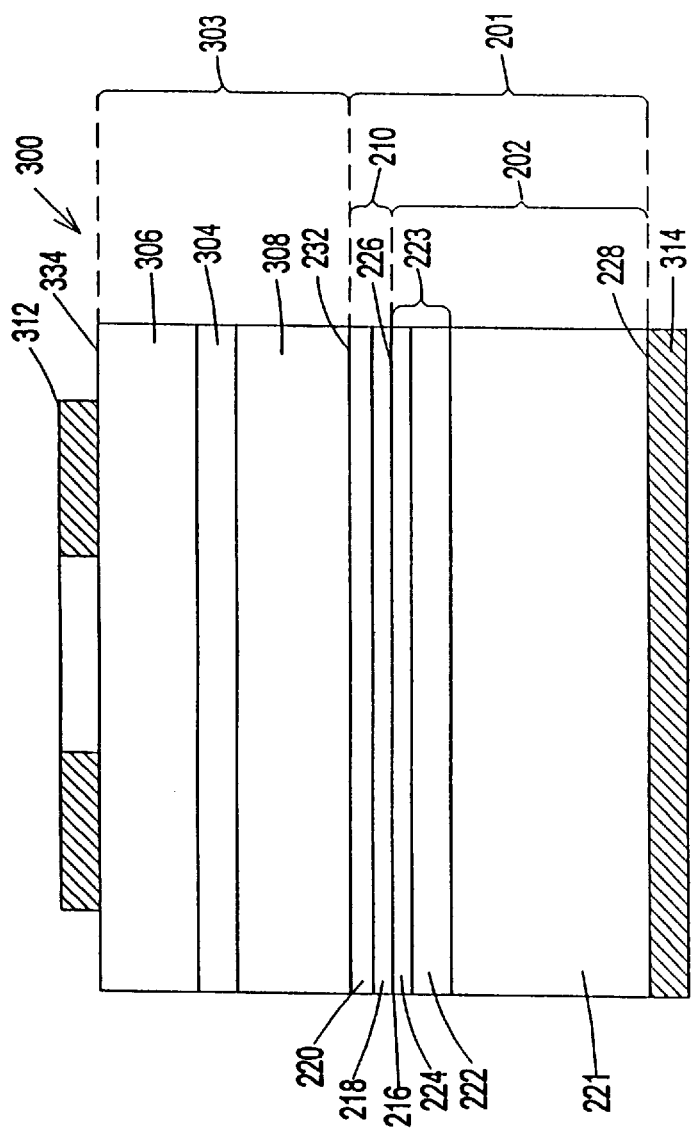
FIG. 3 is a cross-sectional view of a preferred embodiment of an n-drive LED fabricated on a substantially n-type substrate structure according to the invention as a second example of a light-emitting device according to the invention.

FIGS. 2A, 2B and 3 are cross-sectional views of n-drive light-emitting devices according to the invention built on a substantially n-type substrate structure according to the invention. FIG. 2A shows a bottom-emitting n-drive surface-emitting laser (SEL). FIG. 2B shows a top-emitting n-drive SEL. FIG. 3 shows a top-emitting n-drive light-emitting diode (LED).

The substrate structure 201 enables the n-up, p-down light-generating structures 203 shown in FIGS. 2A and 2B, and 303 shown in FIG. 3 to be built on a substantially n-type substrate. The substrate structure 201 will be described with reference to FIGS. 2A, 2B and 3. It should be noted that the light-emitting devices shown in FIGS. 2A, 2B and 3 are not drawn to scale. In particular, the upper and lower regions 206, 208, 306 and 308, the active regions 204 and 304, and the layers 222, 224, and 218 on the substrate structure have been expanded to provide clarity in the drawings. In actual devices, the thickness of the substrate 221 is approximately 500 μm whereas the thickness of the other regions and layers is between about 0.2 and about 2 μm. The electrodes 212, 214, 312, and 314 are approximately 10 μm in diameter. Finally, the terms "upper" and "lower" are respectively used in this description to denote remoteness or proximity of various elements to the substrate 221, and not to indicate any particular spatial orientation.

The substrate structure 201 includes the substrate region 202, the buffer region 210, and the tunnel junction 216 between the substrate region and the buffer region. The substrate region is a region of an n-doped compound semiconductor material. The substrate region has the first surface 226 opposite the second surface 228, and includes the degeneratively n-doped layer 223 adjacent the first surface. The buffer region 210 is a layer of compound semiconductor and is located on the first surface of the substrate region. The compound semiconductor of the buffer region is doped with a p-type dopant and includes the surface 232 remote from the substrate region. The surface 232 provides the p-type surface of the substrate structure. The buffer region also includes the degeneratively p-doped layer 218 adjacent the degeneratively n-doped portion 223 of the substrate region. The tunnel junction 216 is the junction between the degeneratively n-doped layer 223 of the substrate region and the degeneratively p-doped layer 218 of the buffer region.

The substrate structure 201 according to the invention will now be described in more detail. The substrate structure is composed of the substrate region 202 and the buffer region 210. The substrate region is composed of the substrate 221 and the layer 222. The substrate constitutes the majority of the material of the substrate structure (and of the light-emitting device 200 or 300). The substrate is a wafer of GaAs moderately doped with an n-type dopant. The layer 223 is a layer of GaAs degeneratively doped with an n-type dopant. The layer 223 is located on one surface of the substrate. The surface of the layer 223 remote from the substrate provides the first surface 226 of the substrate region.

While an operational substrate structure 201 can be made with a homogeneous layer of GaAs as the layer 223, the voltage drop across the tunnel junction 216, and, hence, the voltage drop across the substrate structure, is reduced by using a layer 223 composed of the layer 222 and the layer 224. The layer 222 is a layer of degeneratively n-doped GaAs, and the layer 224 is a thin, strained pseudomorphic layer of a degenerately n-doped semiconductor material having a lower band gap than the GaAs of the layer 222. The layer 222 is located on the surface of the substrate 221, and the layer 224 is located on the surface of the layer 222, remote from the substrate.

The elements of the substrate region 201 will now be described in more detail.

The substrate 202 is preferably a wafer of GaAs about 500 μm thick. The substrate is doped with an n-type dopant, preferably silicon, at a concentration in the range of $1\times10^{18}$ to $3\times10^{18}$ atoms/cm$^3$.

The layer 222 is a layer of GaAs having a thickness in the range of 1000 to 1500 Ångstroms. The GaAs of the layer 222 is degeneratively doped with an n-type dopant, preferably silicon, at as high a doping concentration as possible. With currently-available technology, the doping concentration in the layer 222 is in the range of $3\times10^{18}$ to $5\times10^{18}$ atoms/cm$^3$.

The layer 224 is a thin, strained pseudomorphic layer of a semiconductor material having a smaller band gap than the GaAs of the layer 222. For example, the layer 224 may be a layer of $In_xGa_{(1-x)}$As having an indium fraction x in the range of 0.1 to 0.3, and a thickness in the range of 250–100 Å. The smaller band gap of the material of the layer 224 and the strain to which the layer 224 is subject reduces the voltage drop across the tunnel junction 216, and, hence, across the substrate structure. The strain in the layer 224 depends on a non-linear inverse relationship between the indium fraction in the InGaAs and the thickness of the layer. Satisfactory results are obtained with these parameters in the ranges set forth above. In the preferred embodiment, the layer 224 had an indium fraction of 0.2 and a thickness of 150 Å.

The InGaAs of the layer 224 is degeneratively doped with an n-type dopant, preferably silicon, at as high a doping concentration as possible. With currently-available technology, the doping concentration in the layer 224 is the range of $5\times10^{18}$ to $1\times10^{19}$ atoms/cm$^3$.

The buffer region 210 is located on the first surface 226 of the substrate region 202, i.e., on the surface of the layer 224 remote from the substrate 221. The buffer region includes the layer 218 adjacent the layer 224 of the substrate region and the layer 220 remote from the substrate region. The junction between the degenerately p-doped layer 218 and the degenerately n-doped layer 224 is the tunnel junction 216.

The layer 218 is a thin layer of GaAs having a thickness in the range of 200 to 1000 Ångstroms. The GaAs of the layer 218 is degeneratively doped with a p-type dopant, preferably carbon, at as high a doping concentration as possible. With currently-available technology, the doping concentration in the layer 218 is about $1\times10^{20}$ atoms/cm$^3$. With a high doping concentration as high as this, the layer 218 need only be about 200 Å thick.

The layer 220 constituting the remainder of the buffer region 210 is a layer of GaAs about 8000 Å thick in the preferred embodiment. The GaAs of the layer 220 is doped with a high level of a p-type dopant, preferably carbon, at a doping concentration in range of $1\times10^{19}$ to $3\times10^{19}$ atoms/cm$^3$, which is substantially lower than in the layer 218.

The p-type surface 232 of the region 220 of the buffer region 210 serves as the p-type surface of the substrate structure 201. P-down devices such as the n-up, p-down n-drive light-generating structures 203 and 303 can be built on the surface 232 of the substrate structure using conventional techniques similar to those used to build n-up, p-down n-drive light-generating structures on conventional p-doped substrates.

As noted above, the junction 216 between the substrate region 202 and the buffer region 210 is a tunnel junction. Current flowing in the forward direction through the p-i-n diode structure of the light-generating structure 203 or 303 flows across the tunnel junction 216 by quantum mechanical tunneling.

Current flowing across the tunnel junction 216 is subject to a voltage drop which impairs the overall efficiency of the light-emitting device 200 or 300. Reducing the voltage drop across the tunnel junction reduces this efficiency impairment. The voltage drop across the tunnel junction depends on the doping levels in the layers 223 and 218 bounding the junction and on the band gap of the materials of these layers. Using as high a doping level as possible in the layers 223 and 218 minimizes the voltage drop across the tunnel junction. The voltage drop across the tunnel junction is further reduced by including the layer 224 in the layer 223. The InGaAs of the layer 224, also degeneratively doped, has a lower band gap than that of the GaAs of the layer 222 on which it is deposited. The band gap is further reduced by the strain to which the layer 224 is subject. The reduced band gap of the layer 224 further reduces the voltage drop across the tunnel junction 216, and, hence, increases the efficiency of the light-emitting device 200 or 300.

Since the light-generating structure 203 or 303 is built on the p-type surface 232 of the substrate structure 201 after the degenerately-doped layers 223 and 218 bounding the tunnel junction 216 have been deposited, it is essential that the dopants in the degeneratively-doped layers 223 and 218 bounding the tunnel junction be highly immobile. Otherwise, when the substrate structure is heated in the process of building the light-generating structure 203 or 303, dopants can out diffuse from the substrate structure into the light-generating structure and can contaminate the light-generating structure. In group III–V semiconductors, the mobility of group IV elements used as dopants is considerably lower than that of group II or group VI elements used as dopants. Thus, when the layers 223 and 218 are formed of group III–V semiconductors, as in the preferred embodiment of the substrate structure described above, the preferred dopants for the degeneratively-doped layers are group IV elements. Silicon is the preferred n-type dopant for the layers 222 and 224, and carbon is the preferred p-type dopant for the layer 218.

The preferred embodiment of the substrate structure 201 is formed from GaAs. The voltage drop between the electrodes 212 and 214 in the light-emitting device 200 or 300 built using the preferred embodiment of the substrate structure was about 1.8 V, of which about 0.3–0.5 V was accounted for by the voltage drop across the substrate structure. The overall voltage drop is comparable with that obtained with a similar light-emitting device built on a conventional p-doped GaAs substrate.

The substrate structure 201 may alternatively be made using other compound semiconductors such as group III–V semiconductors or group II–VI semiconductors. The suitability of a semiconductor for use in the semiconductor substrate depends on the voltage drop across the tunnel junction 216. The voltage drop across the tunnel junction at a given temperature depends on the height of the junction, which is determined by the band gaps of the materials bounding the junction, and the width of the junction, which is determined by the doping levels of the materials bounding the junction. With doping levels that can currently be practicably attained, the voltage drop across the tunnel junction will exceed about 0.5 V if the semiconductor materials have a band gap of greater than about 1.5 eV. If a higher voltage drop across the tunnel junction is acceptable, and/or if the doping levels can be increased, substrate structures can be made using semiconductor materials having a band gap of greater than about 1.5 eV.

The substrate structure is described above in terms of an n-type substrate having a p-type surface, since such a substrate structure is particularly useful for constructing n-drive SELs and LEDs. However, the substrate structure according to the invention can be used to provide a substrate structure having an n-type surface on a p-type substrate. Such a substrate structure would satisfy the need for an n-type substrate of a semiconductor material that has performance disadvantages or is difficult to manufacture in its n-type form.

The substrate structure 201 according to the invention may be used as a substitute for a conventional p-doped substrate in constructing n-drive light-emitting devices such as LEDs and SELs, or other devices conventionally built on a p-type substrate. Like a conventional p-doped substrate, the substrate structure 201 has a p-type surface, i.e., the surface 232, on which the p-type lower region 208 of the light-generating structure 203 can be grown, for example. However, the n-doped substrate 221 that constitutes almost all of the material of the substrate structure is lower in cost, more widely available, and has a lower resistivity than a conventional p-doped substrate. Moreover, the substrate structure 201 can be made with fewer defects than a conventional p-doped substrate. Finally, the dopants used in the substrate structure out diffuse far less readily than the zinc dopant used in the conventional p-doped substrate, notwithstanding their greater concentrations. As a result, unlike the conventional p-doped substrate, dopants do not diffuse out from the substrate structure and contaminate both the light-generating structure 203 or 303 built on the substrate structure and the equipment used to grow the light-generating structure.

The substrate structure 201 according to the invention is made according to the method of the invention by providing a substrate region 202 of semiconductor material of a first conductivity type. The substrate region includes a first surface 226 and a second surface 228. The substrate region adjacent the first surface 226 is degeneratively doped with an impurity of the first conductivity type. A layer of semiconductor material doped with an impurity of a second conductivity type, opposite the first conductivity type is deposited on the first surface 226 of the substrate region to form a buffer region 210. The buffer region includes a surface 232 remote from the substrate region. At least part 218 of the layer adjacent the substrate region is degeneratively doped with the impurity of the second conductivity type to form a tunnel junction 216 between the substrate region and the buffer region.

The method according to the invention of making the substrate structure 201 will now be described in more detail. The substrate 221 is preferably a wafer of GaAs about 500 $\mu$m thick and is doped with an n-type dopant, preferably silicon, at a doping concentration in the range of $1\times10^{18}$–$3\times10^{18}$ atoms/cm$^3$.

The layer 222 is formed by epitaxially growing a layer of GaAs on the surface of the substrate 221. In the preferred embodiment, the layers 222, 224 and 218 were all grown by gas source molecular beam epitaxy (GSMBE). The layers 222, 224 and 218 may alternatively be grown using organometallic vapor-phase epitaxy (OMVPE). This is particularly convenient if the light-generating structure 203 or 303 will later be built on the substrate structure 201 using OMVPE.

A high concentration of an n-type dopant, preferably silicon, is introduced into the GaAs deposited to form the layer 222. The concentration of the dopant is made as high as possible. With currently-available technology, this results in a dopant concentration in the range of $3\times10^{18}$ to $5\times10^{18}$ atoms/cm$^3$. Growing the layer 222 continues until the layer reaches a thickness in the range of 1000 to 1500 Ångstroms.

The layer 224 is formed by epitaxially growing a layer of InGaAs on the surface of the layer 222 by GSMBE or OMVPE as noted above. The fraction of indium in the InGaAs is in the range of 0.1 to 0.3. A high concentration of an n-type dopant, preferably silicon, is introduced into the InGaAs deposited to form the layer 224. The concentration of the dopant is made as high as possible. With currently-available technology, this results in a doping concentration in the range of $5 \times 10^{18}$ to $1 \times 10^{19}$ atoms/cm$^3$. Growing the layer 224 continues until the layer reaches a thickness in the range of 100 to 250 Ångstroms, the actual thickness depending on the fraction of indium in the InGaAs.

The buffer region 210 is formed by growing a layer of GaAs on the surface of the layer 224 by GSMBE or OMVPE as noted above. A high concentration of a p-type dopant, preferably carbon, is introduced into the GaAs deposited to form the layer 218. The concentration of the dopant in the layer 218 is made as high as possible. With currently-available technology, a doping concentration of about $1 \times 10^{20}$ atoms/cm$^3$ is possible. After the layer 218 has reached a thickness in the range of 200–300 Ångstroms, the dopant concentration is reduced to a concentration in the range of $1 \times 10^{19}$ to $3 \times 10^{19}$ atoms/cm$^3$, and the layer 220 constituting the remainder of the buffer region 210 is grown until its thickness is of the order of 8,000 Å.

This completes fabrication of the substrate structure 201.

The n-drive SEL 200 will now be described with reference to FIGS. 2A and 2B as an example of a light-emitting device according to the invention. The SEL 200 is comprised of the substrate structure 201, the light-generating structure 203, and the electrodes 212 and 214. The substrate structure includes the substrate region 202, the buffer region 210, and the tunnel junction 216 between the substrate region and the buffer region as described above. The light-generating structure 203 is a conventional SEL structure as would be built on a conventional p-doped substrate. The light-generating structure 203, a surface-emitting laser in this example, includes the upper region 206, the lower region 208, and the active region 204 sandwiched between the upper region and the lower region. The upper region is a layer of semiconductor material of the first conductivity type and includes the surface 234 remote from the lower region. The lower region 208 is a layer of semiconductor material of the second conductivity type. The light-generating structure is located on the substrate structure 201 with the second conductivity type lower region 208 adjacent the second conductivity-type surface 232 of the buffer region. The first electrode 214 is located on the second surface 228 of the substrate region, and the second electrode 212 is located on the surface 234 of the upper region 206.

In the preferred embodiment, the first conductivity type is n-type. Thus, the invention provides the n-up, p-down n-drive semiconductor laser 200 built using the substantially n-type substrate structure 201.

In the embodiments of the light-emitting device according to the invention shown in FIGS. 2A and 2B, in which the light-generating structure 203 is an n-drive SEL, the upper and lower regions 206 and 208 are mirror regions constructed using known techniques from alternating layers of semiconductor materials having different indices of refraction. The thickness of each layer is chosen to be ¼ of the wavelength in the layer of the light generated in the light-generating region 209 sandwiched between the first and second regions. The alternating layers form distributed Bragg mirrors. The alternating layers are typically layers of AlAs and GaAs or AlAs and AlGaAs.

The light-generating region 209 of the active region 204 generates light due to spontaneous and stimulated emission via the recombination of electrons and holes generated by forward biasing the n-i-p diode constituted by the upper region 206, the active region 204 and the lower region 208. The light-generating region 209 typically includes one or more quantum wells of InGaAs, GaAs, AlGaAs, or InAlGaAs. The light-generating region 209 is separated from the upper and lower regions 206 and 208 by the cladding regions 211a and 211b. The choice and thickness of the material of the cladding regions depends on the wavelength of the light generated in the light-generating region.

Current flowing between the electrodes 212 and 214 causes the SEL 200 to generate light. This current flows though the n-i-p diode structure constituted by the upper region 206, the active region 204 and the lower region 208 in the forward direction. The very high doping levels on opposite sides of the junction 216 between the buffer region 210 and the substrate region 202 cause the junction to be a tunnel junction. The current flowing between the electrodes 212 and 214 reverse biasses the tunnel junction 216 and flows across the junction by quantum mechanical tunneling with a relative small voltage drop. Typically, the tunnel junction is reverse biased by applying a negative voltage to the electrode 212 and connecting the electrode 214 to ground.

An array of SELs can be constructed on a common n-type substrate 221 by forming the substrate structure 201 in the manner described above and then forming the SEL light-generating structures 203 by depositing the layer 208 on the p-type surface 232 of the substrate structure, followed by the layers 204 and 206. The lower region 208 is comprised of alternating layers of p-type semiconductor material having different indices of refraction. The thickness of each layer is chosen to be one quarter of the wavelength in the layer of the light generated in the light generating region 209. For example, if the light generated in the light generating region has a wavelength of 980 nm, each of the alternating layers in the lower region would have a thickness of 9800/4n Å, where n is the refractive index of the layer.

After formation of the lower region 208, the active region 204 is formed. The total thickness of active region 204 is made equal to the wavelength in the active region of the light generated in the light generating region 209, or an integer multiple of this wavelength. Typically, the active region 204 is comprised of the light generating region 209 positioned between the lower cladding region 211a and the upper cladding region 211b. In the preferred embodiment, the lower cladding region 211a is p-doped AlGaAs having a thickness of approximately 1000 Å and a preferred dopant concentration of $5 \times 10^{17}$ atoms/cm$^3$. The light generating region 209 is comprised of alternating AlGaAs barrier layers and GaAs layers (not shown) forming quantum well structures. After formation of the light generating region, the upper cladding region 211b is formed. The upper cladding region is typically n-doped AlGaAs having a thickness of approximately 1000 Å and an n-type dopant concentration of $5 \times 10^{17}$ atoms/cm$^3$.

After formation of the active region 204, the upper region 206 is formed. The upper region 206 is comprised of alternating layers of n-type semiconductor materials having different indices of refraction and a thickness equal to one quarter of the wavelength in the layer of the light generated in the light generating region 209. In the preferred embodiment, there are 15 pairs of alternating layers. For example, the alternating layers may be AlAs doped with silicon having a dopant concentration of $1 \times 10^{18}$ atoms/cm$^3$ and GaAs doped with silicon having a dopant concentration $1\times10^{18}$ atoms/cm$^3$. The zones 230 of the upper region 206 may be converted to zones of high resistivity by an implant step. Typically, this is accomplished by implanting with hydrogen atoms.

After formation of the n-type upper region 206, the electrodes 212 and 214 are formed. FIG. 2A shows a bottom-emitting SEL that includes the tunnel junction 216 formed between the n-type substrate region 202 and the p-type buffer region 210. Thus, in the device structure shown in FIG. 2A, the n-contact 214 is made to the second surface 228 of the substrate 221, and the n-contact 212 is made to the top surface 234 of the n-type mirror region 206. FIG. 2B shows a top-emitting SEL. The top-emitting SEL is similar to the bottom-emitting SEL shown in FIG. 2A, except that the bottom-emitting SEL typically includes the phase-matching layer 236 between the top surface of the n-type upper region 206 and the electrode 212. A phase-matching layer is typically not used in the top-emitting SEL shown in FIG. 2B.

FIG. 3 shows the preferred embodiment of a light-emitting diode (LED) as a second example of a light-emitting device according to the invention. In the LED 300, the electrodes 312 and 314 are deposited on materials of the same conductivity type. Thus, the LED 300 can be an n-up, p-down n-drive LED formed using the substantially n-type substrate structure 201. The LED 300 is comprised of the substrate structure 201, the light-generating structure 303, and the electrodes 312 and 314. The substrate structure includes the substrate region 202, the buffer region 210 and the tunnel junction 216 between the substrate region and the buffer region. The substrate region is a region of semiconductor material of a first conductivity type and includes the first surface 226 opposite the second surface 228. The buffer region is a layer of semiconductor material of a second conductivity type, opposite the first conductivity type. The buffer region is located on the first surface of the substrate region and includes the p-type surface 232, remote from the substrate region.

The light-generating structure 303 includes the upper region 306, the lower region 308, and the active region 304 sandwiched between the upper region and the lower region. The upper region is a layer of semiconductor material of the first conductivity type and includes the surface 334 remote from the lower region. The lower region is a layer of semiconductor material of the second conductivity type. The light-generating structure is located on the substrate structure 201 with the lower region 308 adjacent the p-type surface 232 of the buffer region 210. The first electrode 314 is located on the second surface 228 of the substrate region 201 and the second electrode 312 is located on the surface 334 of the upper region 306.

The LED 300 will now be described in more detail. The LED 300 is composed of the n-drive LED light-generating structure 303 located on the p-type surface 232 of the substrate structure 201. The structure of the substrate structure is the same as that of the substrate structure shown in FIGS. 2A and 2B, and will not be described again here.

The light-generating structure 303, a light-emitting diode in this example, is built on the p-type surface 232 of the buffer region 210 of the substrate structure 201. The lower region 308 is located on the p-type surface 232 of buffer region 210, remote from the substrate region 202. The lower region is a substantially homogeneous layer of AlGaAs having a thickness in the range of 1 μm–2 μm. The AlGaAs of the lower region is doped with any suitable p-type dopant at a doping concentration in the range of $1\times10^{18}$–$3\times10^{18}$ atoms/cm$^3$.

The upper region 306 is located adjacent the lower region 308. The lower region is a substantially homogeneous layer of AlGaAs having a thickness in the range of 1 μm–2 μm. The AlGaAs of the upper region is doped with any suitable n-type dopant at a doping concentration in the range of $1\times10^{18}$–$3\times10^{18}$ atoms/cm$^3$.

The active region 304 is sandwiched between the upper region 306 and the lower region 308. Light is generated in the active region by current passing through the active region from the upper region to the lower region. The active region may simply be the junction between the n-type upper region and the p-type lower region. However, the active region is preferably a layer of GaAs or AlGaAs about 0.5 μm thick sandwiched between the upper region and the lower region. The active region may optionally include one or more quantum wells.

Electrical connections to the LED 300 are provided by the electrodes 312 and 314. The electrode 312 is located on the surface 334 of the upper region 306, remote from the active region 304, and the electrode 314 is located on the second surface 228 of the substrate region 202, remote from the buffer region 210.

The n-drive LED light-generating structure 303 is formed on the p-type surface 232 of the substrate structure 201 using a conventional process similar to that which would be used to form such a structure on the p-type surface of a conventional p-doped substrate. The second region 308 is formed by epitaxially growing a thick layer of AlGaAs on the p-type surface 232 of the substrate structure 201, preferably by OMVPE. A moderate concentration of any suitable p-type dopant, preferably carbon, is introduced into the AlGaAs deposited to form the lower region. The concentration of the dopant is preferably in the range of $1\times10^{18}$–$3\times10^{18}$ atoms/cm$^3$. Growth of the lower region is continued until the thickness of the lower region is in the range of 1 μm–2 μm.

The active region 304 is then formed. The active region may be formed by epitaxially growing the upper region 306 on the lower region 308 to form a p-n junction that constitutes the active region. However, the active region is preferably formed by epitaxially growing a layer of GaAs about 0.5 μm thick on the surface of the lower region. Quantum wells may optionally be formed in the process of growing the active region.

The upper region 306 is formed by epitaxially growing a thick layer of AlGaAs on the active region 304, preferably by OMVPE. A moderate concentration of any suitable n-type dopant, preferably silicon, is introduced into the AlGaAs deposited to form the upper region. The concentration of the dopant is preferably in the range of $1\times10^{18}$–$3\times10^{18}$ atoms/cm$^3$. Growth of the upper region is continued until the thickness of the upper region is in the range of 1 μm–2 μm.

Finally, to complete the LED 300, metal layers are deposited on the surface 334 of the upper region 306 remote from the active region 304 and on the second surface 228 of the substrate structure 201. The metal layers are then masked and etched to define the electrodes 314 and 312.

Although this disclosure describes illustrative embodiments of the invention in detail, it is to be understood that the invention is not limited to the precise embodiments described, and that various modifications may be practiced within the scope of the invention defined by the appended claims.

We claim:

1. A light-emitting device having electrical connections made to regions of the same conductivity type, the light-emitting device comprising:

a substrate structure including:
a substrate region of compound semiconductor material of a first conductivity type, the substrate region including a first surface opposite a second surface,
a buffer region of compound semiconductor material of a second conductivity type, opposite the first conductivity type, the buffer region being located on the first surface of the substrate region and including a surface remote from the substrate region, and
a tunnel junction between the substrate region and the buffer region;

a surface-emitting laser including an upper region of compound semiconductor material of the first conductivity type, a lower region of compound semiconductor material of the second conductivity type, and a light-generating region between the upper region and the lower region, the upper region including a surface remote from the lower region, the surface-emitting laser being located on the substrate structure with the lower region adjacent the surface of the buffer region;

a first electrode located on the second surface of the substrate region; and a second electrode located on the surface of the upper region.

2. The light-emitting device of claim 1, in which current passing between the electrodes causes the surface-emitting laser to generate light and reverse biasses the tunnel junction.

3. The light-emitting device of claim 1, in which the buffer region and the substrate are degeneratively doped at least in portions adjacent the tunnel junction.

4. The light-emitting device of claim 3, in which:
the compound semiconductor material of the substrate is a group III–V semiconductor doped with silicon; and
the compound semiconductor material of the buffer region is a group III–V semiconductor doped with carbon.

5. The light-emitting device of claim 1, in which the compound semiconductor material of the substrate is GaAs, and the first conductivity type is n-type.

6. The light-emitting device of claim 1, in which the substrate structure additionally includes a layer of degenerately-doped strained pseudomorphic semiconductor material on one side of the tunnel junction, the strained pseudomorphic semiconductor material having a lower band gap than the compound semiconductor materials of the substrate region and the buffer region.

7. The light-emitting device of claim 1, in which:
the compound semiconductor material of the substrate region is GaAs;
the compound semiconductor material of the buffer region is GaAs; and
the strained pseudomorphic semiconductor material is InGaAs.

8. A method of making a light-emitting device having electrical connections made to regions of the same conductivity type, the method comprising steps of:

forming a substrate structure by steps including:
providing a substrate region of compound semiconductor material of a first conductivity type, the substrate region including a first surface opposite a second surface,
degeneratively doping the substrate region adjacent the first surface with an impurity of the first conductivity type, and
depositing, on the first surface of the substrate region, a layer of compound semiconductor material doped with an impurity of a second conductivity type, opposite the first conductivity type, to form a buffer region that includes a surface remote from the substrate region, the step of depositing the layer of compound semiconductor material to form the buffer region including a step of degeneratively doping the compound semiconductor material with the impurity of the second conductivity type at least in a portion adjacent the substrate region to form a tunnel junction between the substrate region and the buffer region;

building a surface-emitting laser on the surface of the buffer region of the substrate structure, the surface-emitting including an upper region of compound semiconductor material of the first conductivity type, a lower region of compound semiconductor material of the second conductivity type, and a light-generating region sandwiched between the upper region and the lower region, the upper region including a surface remote from the lower region, the lower region contacting the surface of the buffer region;

forming a first electrode on the second surface of the substrate region; and forming a second electrode on the surface of the upper region.

9. The method of claim 8, in which:
in the step of providing a substrate region, a substrate region including a group III–V semiconductor is provided;
in the step of degeneratively doping the substrate region adjacent the first surface with an impurity of the first conductivity type, the substrate region adjacent the first surface is doped with silicon; and
in the step of depositing a layer of compound semiconductor material doped with an impurity of a second conductivity type to form a buffer region, a layer of a group III–V semiconductor doped with carbon is deposited.

10. The method of claim 8, in which, in the step of providing a substrate region of compound semiconductor material of a first conductivity type, the compound semiconductor material includes GaAs, and the first conductivity type is n-type.

11. The method of claim 8, additionally including a step of depositing a layer of degenerately-doped strained pseudomorphic semiconductor material on one side of the tunnel junction, the strained pseudomorphic semiconductor material having a reduced band gap.

12. The method of claim 11, in which:
in the step of providing a substrate region of compound semiconductor material of a first conductivity type, the semiconductor material includes GaAs;
in the step of depositing a layer of compound semiconductor material doped with an impurity of a second conductivity type to form a buffer region, a layer including GaAs is deposited; and
in the step of depositing a layer of degenerately-doped strained pseudomorphic semiconductor material on one side of the tunnel junction, the strained pseudomorphic semiconductor material deposited includes InGaAs.

* * * * *